(12) United States Patent
Moriya

(10) Patent No.: US 7,800,077 B2
(45) Date of Patent: Sep. 21, 2010

(54) SPECIMEN HOLDER FOR ELECTRON MICROSCOPE

(75) Inventor: Koji Moriya, Tokyo (JP)

(73) Assignee: JEOL Ltd., Tokyo (JP)

( * ) Notice: Subject to any disclaimer, the term of this patent is extended or adjusted under 35 U.S.C. 154(b) by 295 days.

(21) Appl. No.: 11/964,392

(22) Filed: Dec. 26, 2007

(65) Prior Publication Data

US 2009/0014664 A1    Jan. 15, 2009

(30) Foreign Application Priority Data

Dec. 26, 2006   (JP) .............................. 2006-349195

(51) Int. Cl.
*H01J 37/20*   (2006.01)
*G01N 3/02*    (2006.01)

(52) U.S. Cl. ................. 250/440.11; 73/865; 73/862.474

(58) Field of Classification Search ............ 250/442.11, 250/440.11; 359/393
See application file for complete search history.

(56) References Cited

U.S. PATENT DOCUMENTS

| | | | | |
|---|---|---|---|---|
| 3,575,486 A | * | 4/1971 | De Posada et al. .......... | 359/393 |
| 4,596,934 A | * | 6/1986 | Yanaka et al. .......... | 250/442.11 |
| 5,280,178 A | * | 1/1994 | Engelen et al. ........ | 250/440.11 |
| 5,698,856 A | * | 12/1997 | Frasca ................... | 250/440.11 |
| 6,002,136 A | * | 12/1999 | Naeem .................. | 250/442.11 |
| 6,388,262 B1 | * | 5/2002 | Alani et al. ............ | 250/442.11 |
| 7,219,565 B2 | * | 5/2007 | Fischione et al. ...... | 73/862.474 |
| 2004/0003666 A1 | * | 1/2004 | Fischione et al. ............ | 73/856 |

FOREIGN PATENT DOCUMENTS

| | | |
|---|---|---|
| JP | 04 324240 A | 11/1992 |
| JP | 8-017381 | 1/1996 |
| JP | 3605119 | 8/2004 |

* cited by examiner

*Primary Examiner*—Jack I Berman
*Assistant Examiner*—Johnnie L Smith
(74) *Attorney, Agent, or Firm*—The Webb Law Firm

(57) ABSTRACT

The present invention provides a specimen holder for use with an electron microscope. The specimen holder has a retainer mounted at the front end of the body of the specimen holder. The retainer has a plate member provided with a hole around its front end. The hole provides a reference in securing the whole specimen for a desired field of view. A circular groove is formed in the plate member and used to place the specimen in position. Any members lying perpendicularly to the tilted axis at the position of the specimen are cut out.

1 Claim, 7 Drawing Sheets

SPECIMEN HOLDER FOR ELECTRON MICROSCOPE

BACKGROUND OF THE INVENTION

1. Field of the Invention

The present invention relates to a specimen holder for use with an electron microscope (EM) and, more particularly, to an EM specimen holder capable of obtaining a specimen image even at high tilt angles. In recent years, tomography, that is, a three-dimensional image reconstruction technique, has attracted attention chiefly in biological fields. In tomography, images of a tilted specimen are processed. If the amount of information about the specimen is increased, a more accurate three-dimensional image can be built. The present invention relates to an EM specimen holder used for acquisition of the information.

2. Description of Related Art

FIG. 5 shows the outer appearance of a prior art specimen holder for use with an electron microscope. The entire holder is shown. The body of the specimen holder is indicated by numeral 1. The holder has a handle 2. A retainer 3 (specimen-holding portion) for holding a specimen 4 is mounted at the front end of the body 1 of the holder. The specimen 4 is held to the retainer 3. The body 1 of the specimen holder has a tilted axis 5. The body 1 of the specimen holder is mounted to a goniometer (not shown) for an electron microscope. The body 1 of the holder is tilted about the tilted axis 5 by the tilting mechanism of the goniometer. Directions of tilt are indicated by the arrows A. As shown, the specimen holder is tilted in a clockwise direction and in a counterclockwise direction.

FIG. 6 is an exploded perspective view of the prior art retainer. In both FIGS. 5 and 6, like components are indicated by like reference numerals. In FIG. 6, a plate member 10 is used to attach the specimen 4 having a diameter of about 3.0 to 3.2 mm and a thickness of about 50 µm. A hole 10a is formed around the front end of the plate member 10. The hole 10a provides a reference in searching the whole specimen for a desired field of view. A circular groove 10b is formed around the front end of the plate member 10 and used to determine the position of the specimen. A notch 10c is formed at the foremost end of the plate member 10 and offers an insertion port into which the front ends of tweezers are inserted when the specimen is taken out.

A leaf spring 11 is used to hold down the specimen 4. The leaf spring 11 is mounted into a threaded hole 10d formed in the plate member 10 by a screw 12. A method of holding the specimen with the retainer constructed as described so far is next described.

First, the specimen 4 is placed along the circular groove 10b formed in the plate member 10. Then, the leaf spring 11 is held to the plate member 10 with the screw 12. As a result, the specimen 4 is held to the plate member 10 by the force of the leaf spring 11.

A known device of this kind uses a cartridge whose body has a front-end portion in which a meshed portion is formed. A slice of a specimen is picked up by this meshed portion (see, for example, JP-A-8-17381 (paragraph 0010; FIGS. 1 and 2)). Furthermore, a holder for carrying a slice of a specimen while maintaining it at a low temperature is known (see, for example, Japanese Patent No. 3,605,119 (from page 4, line 32 to page 5, line 4; FIG. 1)). The slice of the specimen includes a specimen slice grid made of a thermally conductive material. The specimen slice grid has plural grid bars intersecting each other so as to form grid openings. Each of the grid openings has a length and a width. The longitudinal direction of each grid opening is substantially perpendicular to the longitudinal axis of the holder body. The length of each grid opening is greater than the width of each grid opening. The slice of the specimen can be rotated through an angle of at least 90° in both directions from the horizontal direction.

FIGS. 7A-7D illustrate the effective field of view when the prior art retainer is tilted. In all of FIGS. 6 and 7A-7D, like components are indicated by like reference numerals. The direction in which the retainer is observed is shown in FIG. 7B. FIG. 7A shows the state in which the tilt angle is 0°. The specimen 4 is placed on the plate member 10. The specimen 4 is held from above with the leaf spring 11. When an electron beam EB is directed at the specimen from above it, an image B is focused onto a fluorescent screen. The diameter of the effective field of view is 2 mm.

When the tilt angle is 60°, the specimen 4 is tilted at an angle of 60° as shown in FIG. 7C. As a result, an elliptical field of view can be secured as indicated by C on the image focused on the fluorescent screen. FIG. 7D shows the state in which the tilt angle is 80°. In this case, the field of vision is blocked by the leaf spring 11 and by the wall defining the circular groove 10b. The image on the fluorescent screen is invisible. When the specimen is taken out, it is difficult to bring tweezers to capture the specimen. There is the problem that the specimen is damaged or scratched. In addition, it is necessary that the specimen can be placed in position easily and reliably when the specimen is mounted. Moreover, it is necessary that the specimen can be taken out easily and reliably.

SUMMARY OF THE INVENTION

It is an object of the present invention to provide an EM specimen holder which permits a field of view to be obtained at a tilt angle that is made as close as possible to 90° and which can be manipulated easily.

A first embodiment of the present invention provides a specimen holder which is for use with an electron microscope and which includes a holder body having a specimen-holding portion at the front end of the holder body. The specimen-holding portion has a plate member provided with a hole to permit passage of an electron beam. A groove is formed around the hole formed in the plate member to permit the specimen to be placed in position. The groove has cutouts lying perpendicularly to the tilted axis of the specimen holder.

A second embodiment of the present invention is based on the first embodiment and further characterized in that the width of a specimen-installing portion taken perpendicularly to the tilted axis of the specimen holder is smaller than the diameter of the specimen.

According to the first embodiment of the present invention, a field of view can be obtained at a tilt angle that is made as close as possible to 90° by cutting away any members lying perpendicularly to the tilted axis at the specimen position.

According to the second embodiment of the present invention, the specimen can be taken out with improved manipulations.

These and other objects and advantages of the present invention will become more apparent from the following description.

DESCRIPTION OF THE PREFERRED EMBODIMENTS

Figure 1:
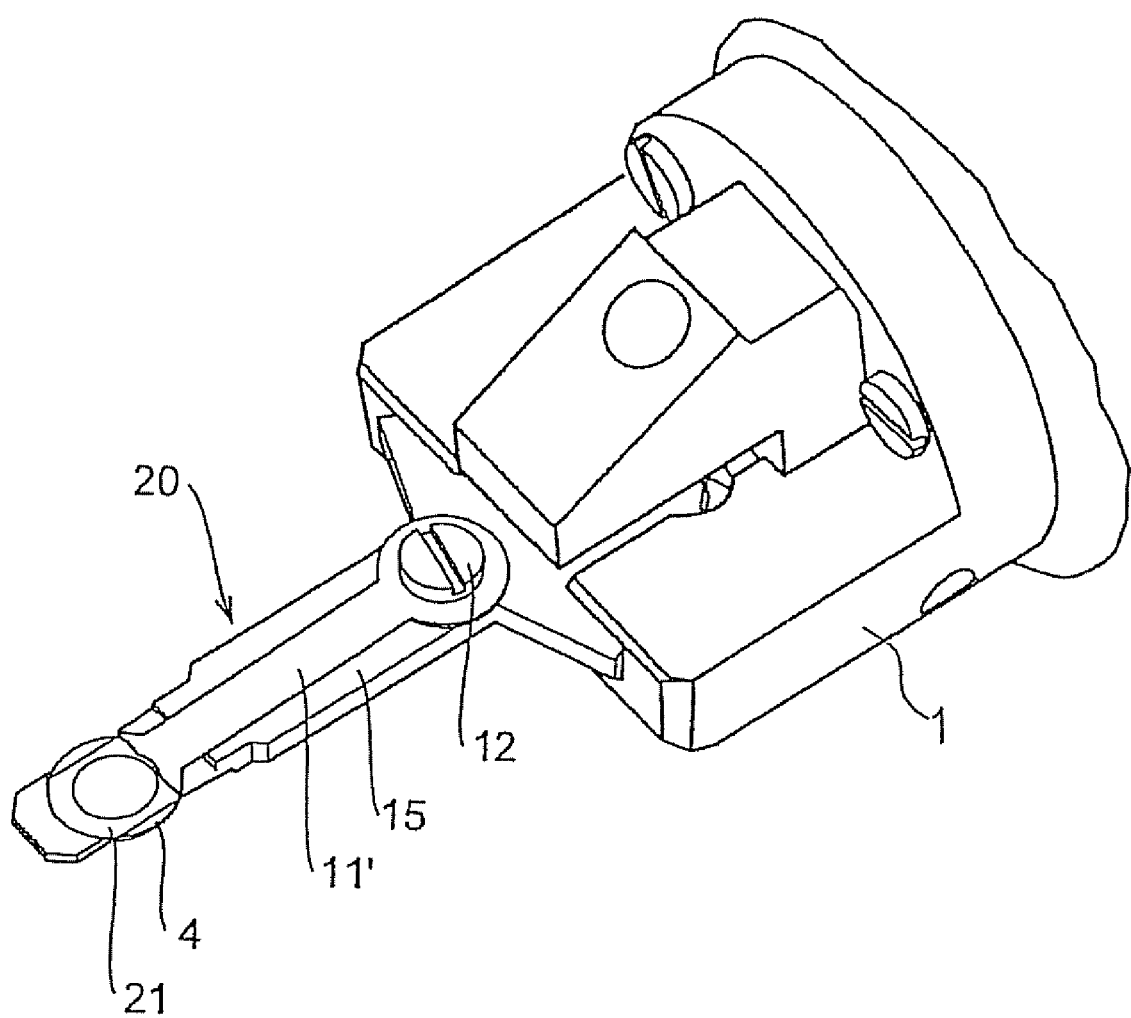
FIG. 1 is a perspective view of a retainer according to one embodiment of the present invention.
Figure 6:
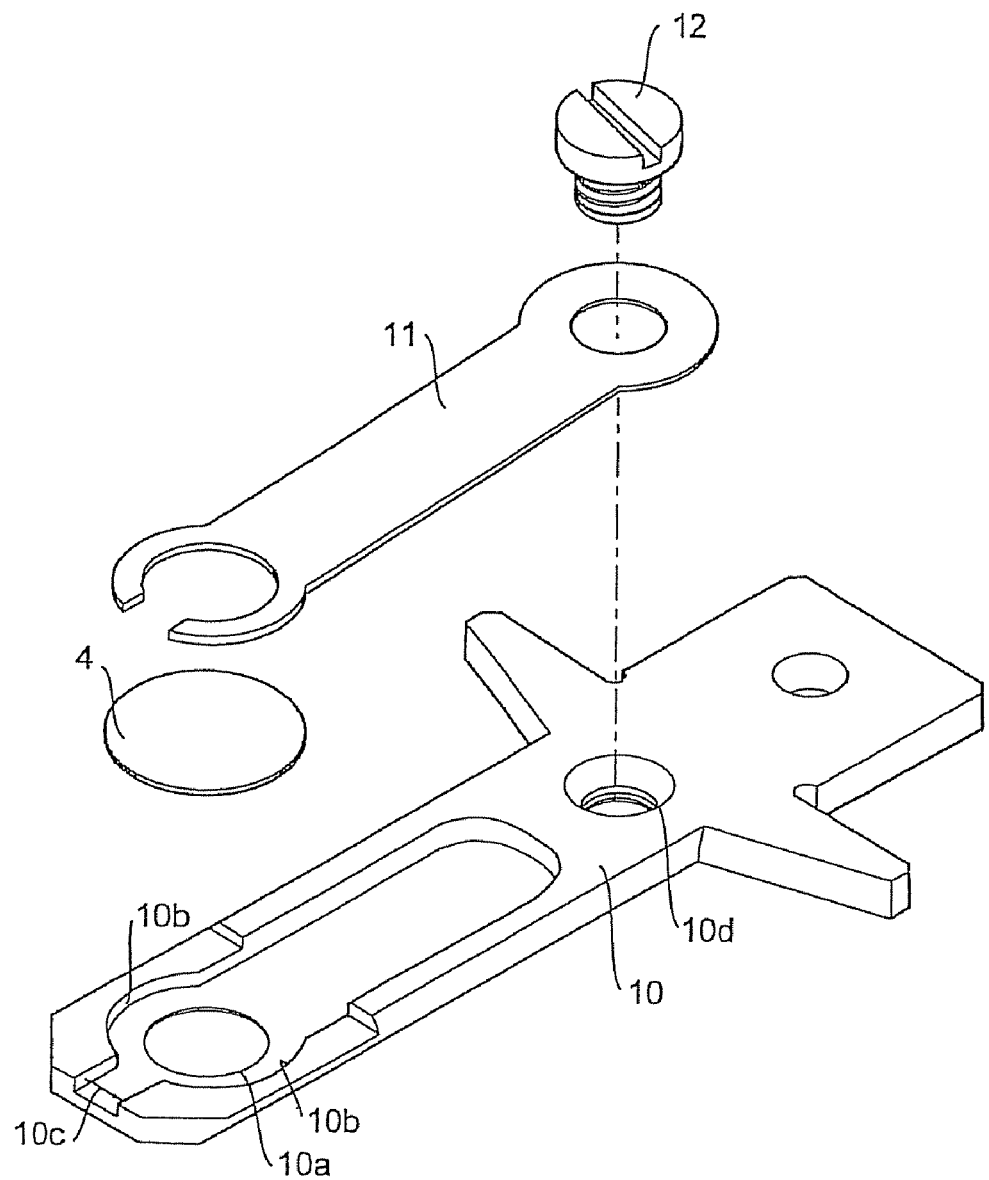
FIG. 6 is an exploded perspective view of the prior art specimen holder shown in FIG. 5.
Figure 7A:
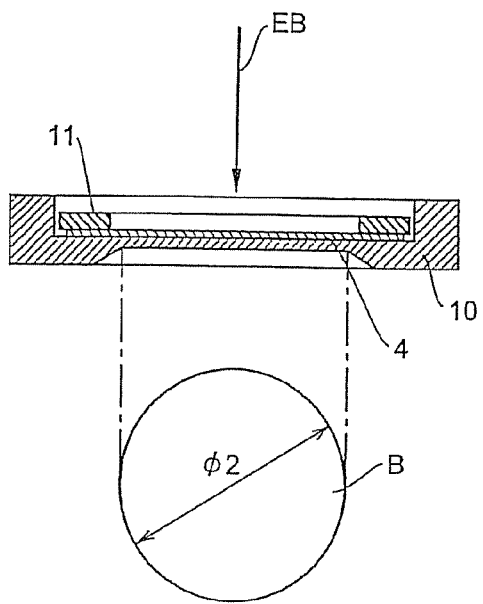
FIGS. 7A-7D illustrate an effective field of view when the prior art retainer shown in FIGS. 5 and 6 is tilted.
Figure 7B:
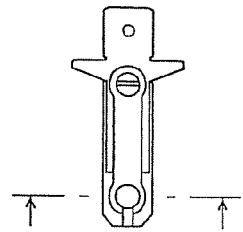
Figure 7C:
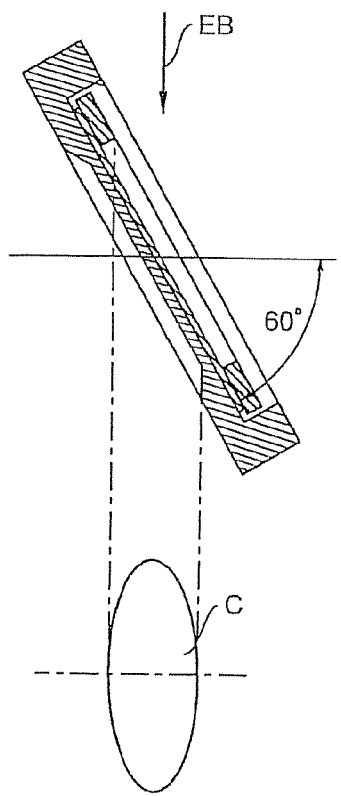
Figure 7D:
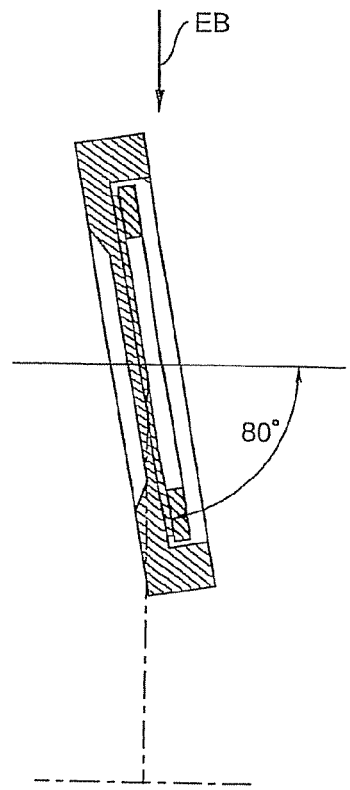

Embodiments of the present invention are hereinafter described in detail with reference to the accompanying drawings. FIG. 1 is a perspective view of a retainer according to one embodiment of the present invention, showing the outer appearance of the retainer. In FIGS. 1 and 6, like components are indicated by like reference numerals. In FIG. 1, the retainer, generally indicated by reference numeral 20, is held to the body of a specimen holder by the same method as in the prior art. Also shown in FIG. 1 are a specimen 4, a plate member 15, a leaf spring 11', and a screw 12 for holding the leaf spring 11' to the plate member 15. The retainer 20 has a specimen-installing portion 21 around its front end. As is seen in the figure, the specimen 4 is greater than the specimen-installing portion 21. Because the part of the specimen-holding portion is smaller than the specimen in this way, the specimen 4 can be easily held between tweezers. Consequently, the specimen can be removed with improved manipulations.

Figure 2:
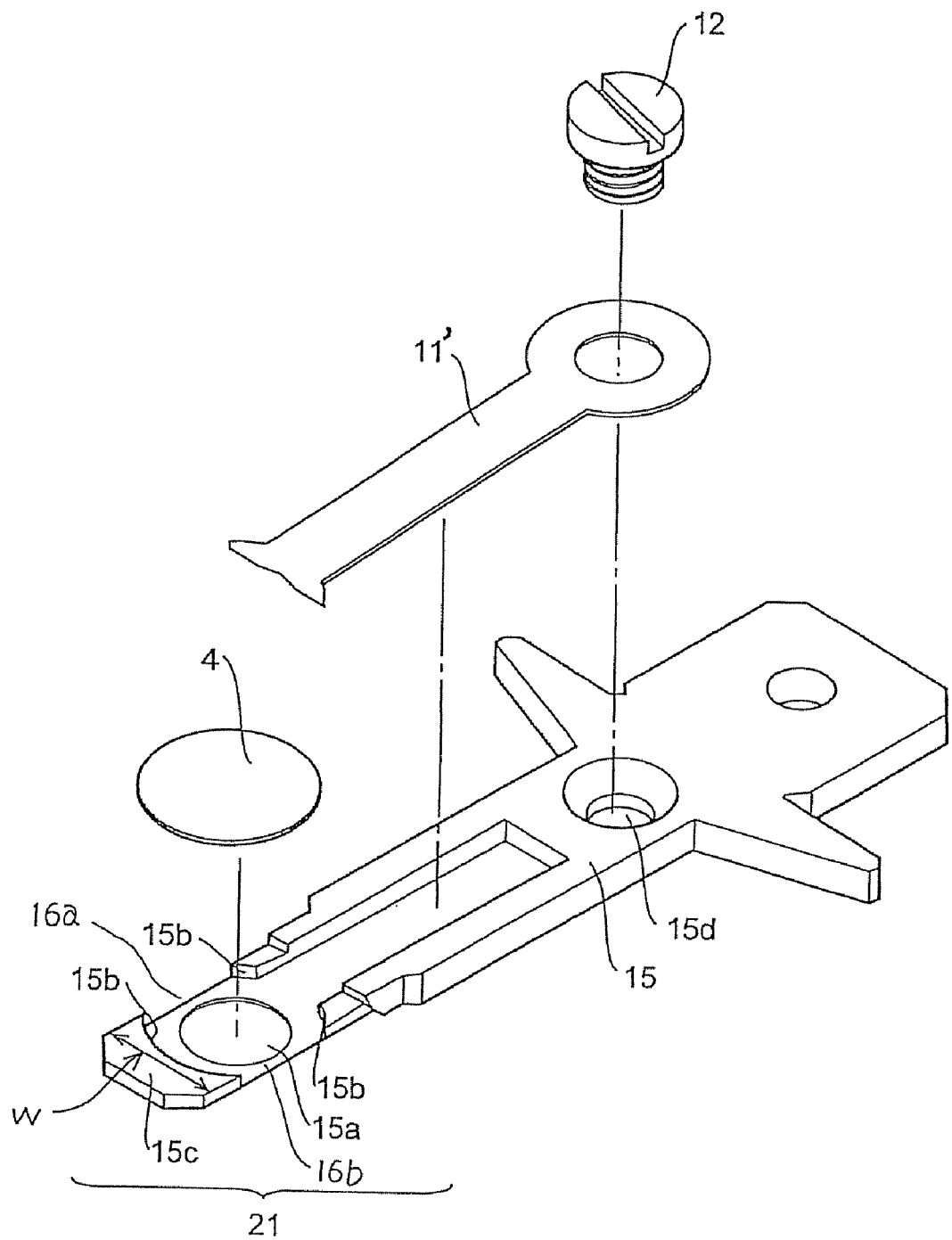
FIG. 2 is an exploded perspective view of the retainer shown in FIG. 1.

FIG. 2 is an exploded perspective view of the retainer shown in FIG. 1, the retainer being built according to one embodiment of the present invention. In FIGS. 1, 2, and 6, like components are indicated by like reference numerals. In FIG. 2, the plate member 15 is used to attach the specimen 4 having a diameter of about 3.0 to 3.2 mm and a thickness of about 50 µm. A hole 15a permitting passage of an electron beam is formed around the front end of the plate member 15. The hole 15a provides a reference in searching the whole specimen for a desired field of view. A circular groove 15b is formed around the front end of the plate member 15, and is used to determine the position of the specimen. The groove 15b is formed around the hole 15a. The groove 15b has cutouts 16a and 16b. An arcuate member 15c is formed at the foremost end of the plate member 15. The width w of the arcuate member 15c is made smaller than the diameter of the specimen to eliminate all parts (corresponding to the cutouts 16a and 16b) which would otherwise constitute obstacles during tilting.

Figure 5:
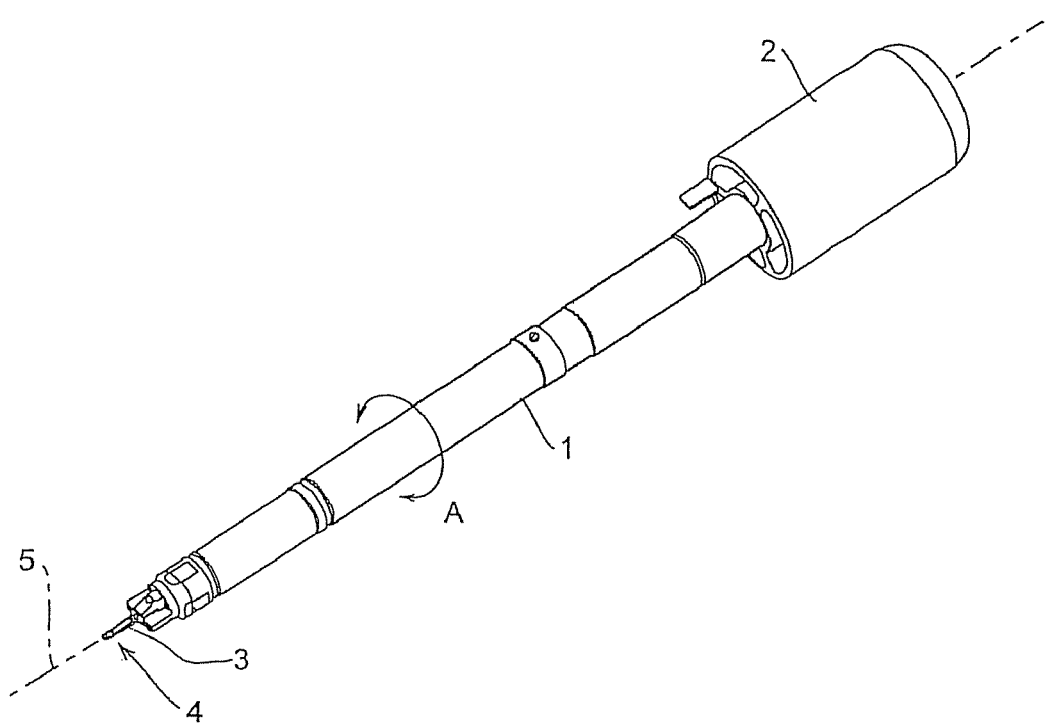
FIG. 5 is a perspective view of a prior art specimen holder for use with an electron microscope.

In this way, in the present invention, with respect to the groove 15b, the portions (corresponding to the cutouts 16a and 16b) lying perpendicularly to the tilted axis 5 (see FIG. 5) of the specimen holder are cut away. As a result, the specimen 4 can be picked up easily with tweezers from the cutouts 16a and 16b. The hole 15a, circular groove 15b, and arcuate member 15c together form the specimen-installing portion 21. The width w of the specimen-installing portion 21 taken perpendicularly to the tilted axis 5 (see FIG. 5) of the specimen holder is smaller than the diameter of the specimen 4.

A leaf spring 11' is used to hold down the specimen 4, and has a claw-shaped front end. The leaf spring 11' is mounted with the screw 12 in a threaded hole 10d formed in the plate member 15. A method of holding the specimen by the device constructed in this way is next described.

First, the specimen 4 is placed along the circular groove 15b formed in the plate member 15. Then, the leaf spring 11' is held to the plate member 15 with the screw 12. As a result, the specimen 4 is held to the plate member 15 by the force of the leaf spring 11'.

In the present invention, any members (corresponding to the cutouts 16a and 16b in FIG. 2) lying perpendicularly to the tilted axis at the position of the specimen are cut away. Because of this structure, a field of view can be obtained at a tilt angle that is made as close as possible to 90°. Furthermore, according to the present invention, the specimen can be taken out with improved manipulations.

Figure 3:
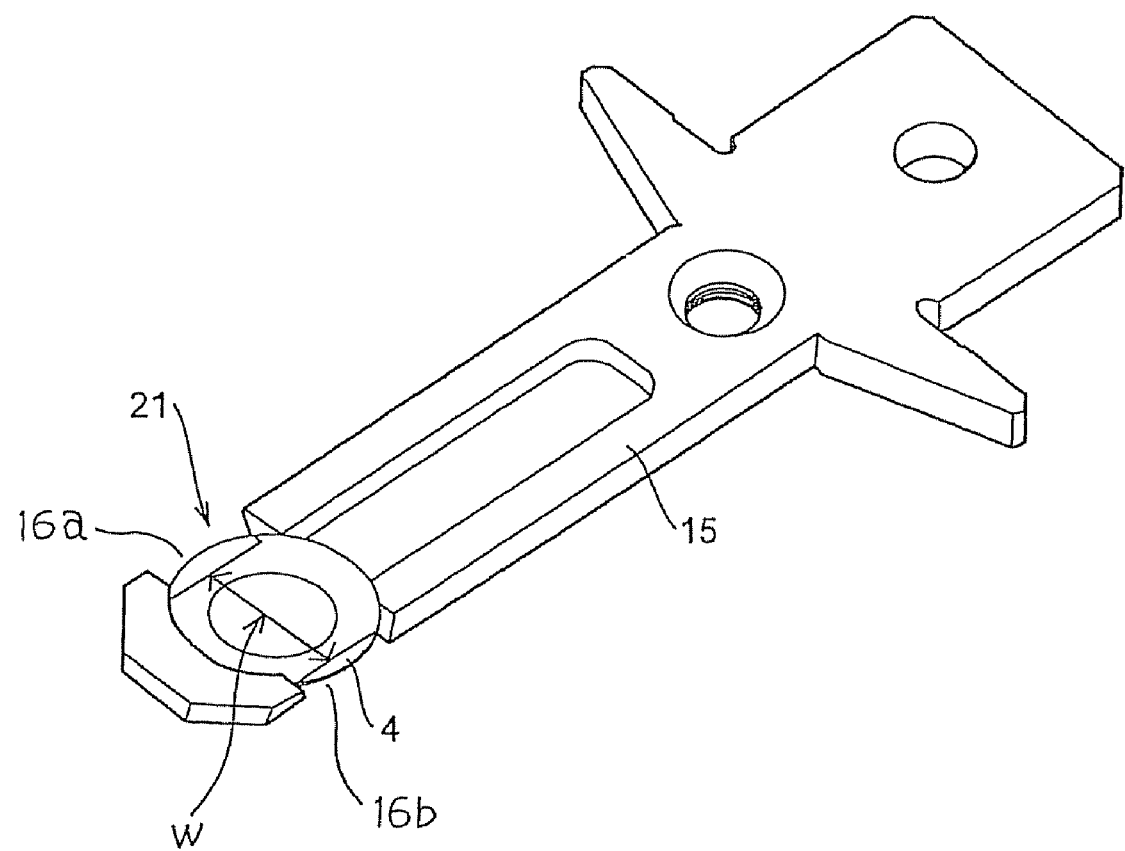
FIG. 3 is a perspective view of the retainer shown in FIGS. 1 and 2, but showing a different state.

FIG. 3 is a perspective view of the retainer shown in FIGS. 1 and 2, but showing a different state. In both FIGS. 2 and 3, like components are indicated by like reference numerals. FIG. 3 shows the state in which the specimen 4 is installed on the retainer 20. It can be seen that because the specimen-installing portion 21 is smaller than the specimen 4, the specimen 4 can be taken out with good manipulations.

Figure 4A:
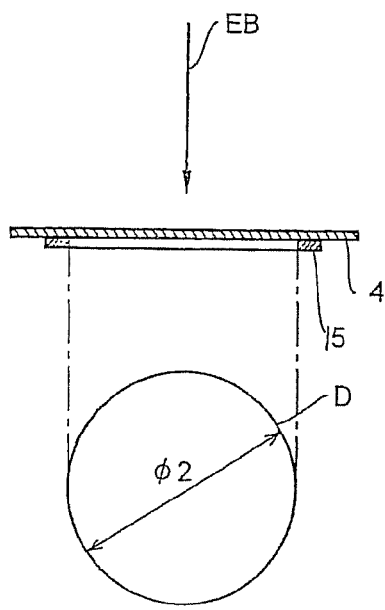
FIGS. 4A-4D illustrate an effective field of view when a retainer according to the present invention is tilted.
Figure 4B:
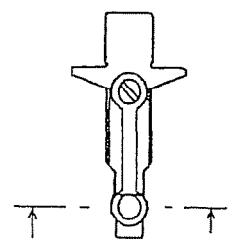

FIGS. 4A-4D illustrate an effective field of view when the retainer according to the present invention is tilted. In both FIGS. 2 and 4A-4D, like components are indicated by like reference numerals. The leaf spring 11' is omitted because it does not affect blockage of the field of view. The direction in which the retainer is observed is indicated in FIG. 4B. FIG. 4A shows the state in which the tilt angle is 0°. The specimen 4 is placed on the plate member 15. The specimen 4 is held down from above by the leaf spring 11' (not shown). An electron beam EB is directed from above the specimen. An image D is focused on the fluorescent screen. The diameter of the effective field of view is 2 mm.

Figure 4C:
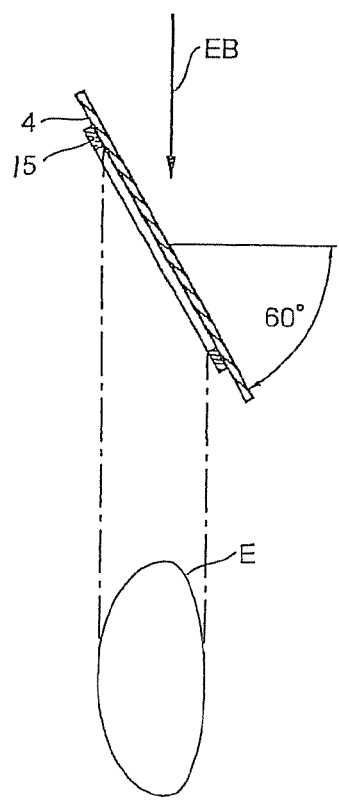
Figure 4D:
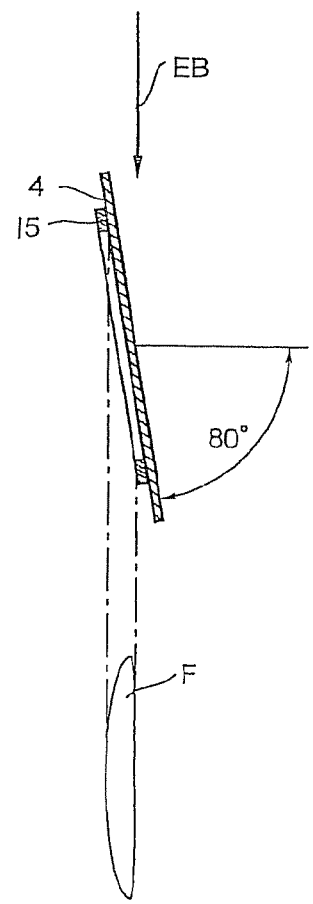

When the tilt angle is 60°, the specimen 4 is tilted by an angle of 60° as shown in FIG. 4C. As a result, an elliptical field of view E can be secured on the image obtained on the fluorescent screen. FIG. 4D shows the state in which the tilt angle is 80°. Also, in this case, member portions lying perpendicularly to the tilted axis at the specimen position are eliminated. Therefore, the field of vision is blocked neither by the leaf spring 11' nor by the wall defining the circular groove 15b. The image on the fluorescent screen is secured as indicated by F.

Furthermore, when the specimen is taken out, the tweezers can be treated with good manipulations. The specimen 4 can be placed in position easily and reliably in mounting the specimen. In addition, the specimen 4 can be withdrawn easily and reliably. The leaf spring 11' has the cutouts not to block the field of view, unlike the prior art structure. However, rotation and positional deviation of the specimen can be suppressed because the specimen is held down reliably with the spring and because the cutouts are made angular.

The advantages of the present invention are listed below.

1) Any members lying perpendicularly to the tilted axis about the specimen are cut away. Consequently, a field of view can be secured up to large angles of tilt while maintaining the easiness with which the specimen is mounted and detached. Furthermore, a wide effective field of view can be obtained at each angular position.

2) The specimen can be easily picked up by tweezers or the like by designing the device such that the specimen protrudes from the plate member. In consequence, the specimen can be prevented from being damaged or scratched.

3) The front end of the hold-down spring (leaf spring 11') is claw-shaped as shown. The hold-down force simultaneously suppresses motions of the specimen, such as rotation.

Having thus described my invention with the detail and particularity required by the Patent Laws, what is desired protected by Letters Patent is set forth in the following claims.

The invention claimed is:
1. A specimen holder for use with an electron microscope and including a holder body having a specimen-holding portion formed at its front end,
   wherein said specimen-holding portion has a plate member provided with a hole to permit passage of an electron beam, and
   wherein a generally circular groove is formed around said hole in the plate member and is used to place the for securing edges of a generally circular specimen in position, the groove having cutouts lying perpendicularly to a tilted axis of the specimen holder, wherein the width of the specimen-holding portion taken perpendicularly to the tilted axis of the specimen holder is smaller than the diameter of the generally circular groove for holding the specimen.

* * * * *

UNITED STATES PATENT AND TRADEMARK OFFICE
CERTIFICATE OF CORRECTION

PATENT NO. : 7,800,077 B2  Page 1 of 1
APPLICATION NO. : 11/964392
DATED : September 21, 2010
INVENTOR(S) : Moriya It is certified that error appears in the above-identified patent and that said Letters Patent is hereby corrected as shown below:

Column 5, line 9 bridging to Column 6, line 1, "place the for securing edges"
should read -- place the securing edges --

Signed and Sealed this

Fifteenth Day of February, 2011

David J. Kappos
Director of the United States Patent and Trademark Office